(12) United States Patent
Lee

(10) Patent No.: US 10,418,414 B2
(45) Date of Patent: Sep. 17, 2019

(54) VARIABLE RESISTANCE MEMORY DEVICES

(71) Applicant: Samsung Electronics Co., Ltd., Suwon-si, Gyeonggi-do (KR)

(72) Inventor: Jung-hyuk Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/987,483

(22) Filed: May 23, 2018

(65) Prior Publication Data

US 2019/0123099 A1    Apr. 25, 2019

(30) Foreign Application Priority Data

Oct. 25, 2017    (KR) .......................... 10-2017-0139546

(51) Int. Cl.
| | | |
|---|---|---|
| *G11C 11/16* | (2006.01) | |
| *H01L 27/22* | (2006.01) | |
| *H01L 23/528* | (2006.01) | |
| *H01L 23/522* | (2006.01) | |
| *H01L 27/24* | (2006.01) | |

(Continued)

(52) U.S. Cl.
CPC .......... *H01L 27/228* (2013.01); *G11C 11/161* (2013.01); *G11C 11/1673* (2013.01); *G11C 11/1675* (2013.01); *H01F 10/329* (2013.01); *H01F 10/3254* (2013.01); *H01F 10/3272* (2013.01); *H01F 10/3286* (2013.01); *H01L 23/528* (2013.01); *H01L 23/5226* (2013.01); *H01L 27/2436* (2013.01); *H01L 27/2463* (2013.01); *H01L 43/08* (2013.01); *H01L 45/06* (2013.01); *H01L 45/08* (2013.01); *H01L 45/1233* (2013.01); *G11C 13/0004* (2013.01); *G11C 13/004* (2013.01); *G11C 13/0007* (2013.01); *G11C 13/0069* (2013.01); *G11C 2213/31* (2013.01); *G11C 2213/32* (2013.01); *G11C 2213/52* (2013.01); *H01L 45/126* (2013.01); *H01L 45/144* (2013.01); *H01L 45/146* (2013.01); *H01L 45/147* (2013.01)

(58) Field of Classification Search
CPC ........................ G11C 11/1659; G11C 11/1675
See application file for complete search history.

(56) References Cited

U.S. PATENT DOCUMENTS

| | | |
|---|---|---|
| 8,159,870 B2 | 4/2012 | Xia |
| 8,274,112 B2 | 9/2012 | Kim et al. |

(Continued)

FOREIGN PATENT DOCUMENTS

KR    10-1488939    1/2015

*Primary Examiner* — Thomas L Dickey
(74) *Attorney, Agent, or Firm* — Myers Bigel, P.A.

(57) ABSTRACT

Variable resistance memory devices are provided. A variable resistance memory device includes a memory cell that includes a switching device and a resistance sensing element that is connected in series with the switching device. The variable resistance memory device includes a word line that extends in a first direction and that is connected to a gate of the switching device. Moreover, the variable resistance memory device includes a plurality of bit lines extending in a second direction. A first connection node of a first bit line among the plurality of bit lines is electrically connected to the resistance sensing element. A second connection node of a second bit line, among the plurality of bit lines, adjacent the first bit line is electrically connected to the switching device.

20 Claims, 13 Drawing Sheets

(51) Int. Cl.
*H01L 43/08* (2006.01)
*H01F 10/32* (2006.01)
*H01L 45/00* (2006.01)
*G11C 13/00* (2006.01)

(56) References Cited

U.S. PATENT DOCUMENTS

| | | |
|---|---|---|
| 8,422,271 B2 | 4/2013 | Carter et al. |
| 8,907,390 B2 | 12/2014 | Reid |
| 9,299,409 B2 | 3/2016 | Miyakawa et al. |
| 9,330,745 B2 | 5/2016 | Seo et al. |
| 9,685,230 B2 | 6/2017 | Lee et al. |
| 9,691,967 B2 | 6/2017 | Kim et al. |
| 2010/0103718 A1* | 4/2010 | Asao ................ G11C 11/1659 365/148 |
| 2014/0021426 A1 | 1/2014 | Lee et al. |
| 2016/0005458 A1 | 1/2016 | Shu et al. |

* cited by examiner

VARIABLE RESISTANCE MEMORY DEVICES

CROSS-REFERENCE TO RELATED APPLICATION

This application claims the benefit of Korean Patent Application No. 10-2017-0139546, filed on Oct. 25, 2017, in the Korean Intellectual Property Office, the disclosure of which is hereby incorporated herein in its entirety by reference.

BACKGROUND

The present disclosure relates to semiconductor devices and, more particularly, to variable resistance memory devices. A variable resistance memory device may include a resistance sensing element (e.g., a variable resistance layer) and may use a current transmission characteristic of the resistance sensing element in accordance with an applied voltage. In the variable resistance memory device, conductive/interconnect lines (e.g., bit lines or source lines) may be electrically connected to an upper portion and a lower portion of a variable resistance layer. Therefore, in the variable resistance memory device, line resistance or parasitic resistance of the conductive/interconnect lines may be undesirably high and a circuit configuration may be undesirably complex.

SUMMARY

The present inventive concepts provide a variable resistance memory device capable of reducing resistance of interconnect lines such as a bit line and simplifying a circuit configuration. According to example embodiments of the present inventive concepts, a variable resistance memory device may include a memory cell that includes a switching device and a resistance sensing element that is connected in series with the switching device. The variable resistance memory device may include a word line that extends in a first direction and that is connected to a gate of the switching device. The variable resistance memory device may include a plurality of bit lines extending in a second direction. A first connection node of a first bit line among the plurality of bit lines may be electrically connected to the resistance sensing element. A second connection node of a second bit line, among the plurality of bit lines, adjacent the first bit line may be electrically connected to the switching device.

A variable resistance memory device, according to example embodiments of the present inventive concepts, may include a plurality of memory cells including a plurality of resistance sensing elements, respectively, and a plurality of switching devices, respectively. The plurality of resistance sensing elements may be connected in series with the plurality of switching devices, respectively. The variable resistance memory device may include a plurality of word lines extending in a first direction and spaced apart from each other in a second direction. The plurality of word lines may be connected to a plurality of gates, respectively, of the plurality of switching devices, respectively. Moreover, the variable resistance memory device may include a plurality of bit lines extending in the second direction and spaced apart from each other in the first direction. A first connection node of a first bit line among the plurality of bit lines may be electrically connected to first ones of the plurality of resistance sensing elements, and a second connection node of a second bit line, among the bit lines, adjacent the first bit line may be electrically connected to first ones of the plurality of switching devices. The first ones of the plurality of resistance sensing elements may be connected in series with the first ones of the plurality of switching devices, respectively. A third connection node of the first bit line may be electrically connected to second ones of the plurality of switching devices, and a fourth connection node of the second bit line may be electrically connected to second ones of the plurality of resistance sensing elements. The second ones of the plurality of resistance sensing elements may be connected in series with the second ones of the plurality of switching devices, respectively.

A variable resistance memory device, according to example embodiments of the present inventive concepts, may include a plurality of first memory cell groups spaced apart from each other in a first direction and a second direction perpendicular to the first direction. Each of the plurality of first memory cell groups may include a first plurality of memory cells including a first plurality of resistance sensing elements, respectively, that is connected in series with a first plurality of switching devices, respectively. Ones of the first plurality of switching devices may be electrically connected to each other. The variable resistance memory device may include a plurality of second memory cell groups between the first plurality of memory cell groups. Each of the plurality of second memory cell groups may include a second plurality of memory cells including a second plurality of resistance sensing elements, respectively, that is connected in series with a second plurality of switching devices, respectively. Ones of the second plurality of switching devices may be electrically connected to each other. The variable resistance memory device may include a plurality of word lines spaced apart from each other in the second direction, extending in the first direction, and electrically connected to gates of the first plurality of switching devices and the second plurality of switching devices. The variable resistance memory device may include first bit lines that are spaced apart from each other the first direction, that extend in the second direction, that are electrically connected to the first plurality of resistance sensing elements, and that are electrically connected to the second plurality of switching devices. Moreover, the variable resistance memory device may include second bit lines adjacent the first bit lines. The second bit lines may be electrically connected to the first plurality of switching devices, and may be electrically connected to the second plurality of resistance sensing elements.

A variable resistance memory device according to the present inventive concepts may operate a memory cell by having a current flow to a resistance sensing element by using a first bit line and a second bit line that is adjacent the first bit line. Therefore, in the variable resistance memory device according to the present inventive concepts, it may not be necessary to use a source line. Therefore, widths of the bit lines may be large so that parasitic resistances of the bit lines may be reduced.

In a variable resistance memory device according to the present inventive concepts, during a write operation, bit lines on the left and right of a selected memory cell may be used so that a circuit may be configured simply. Furthermore, in the variable resistance memory device according to the present inventive concepts, current paths may be in a second direction (e.g., a Y direction), that is, the same direction, or may be in opposite directions, and thus a circuit may be configured simply.

BRIEF DESCRIPTION OF THE DRAWINGS

Embodiments of the present inventive concepts will be more clearly understood from the following detailed description taken in conjunction with the accompanying drawings in which.

DETAILED DESCRIPTION

Figure 1:
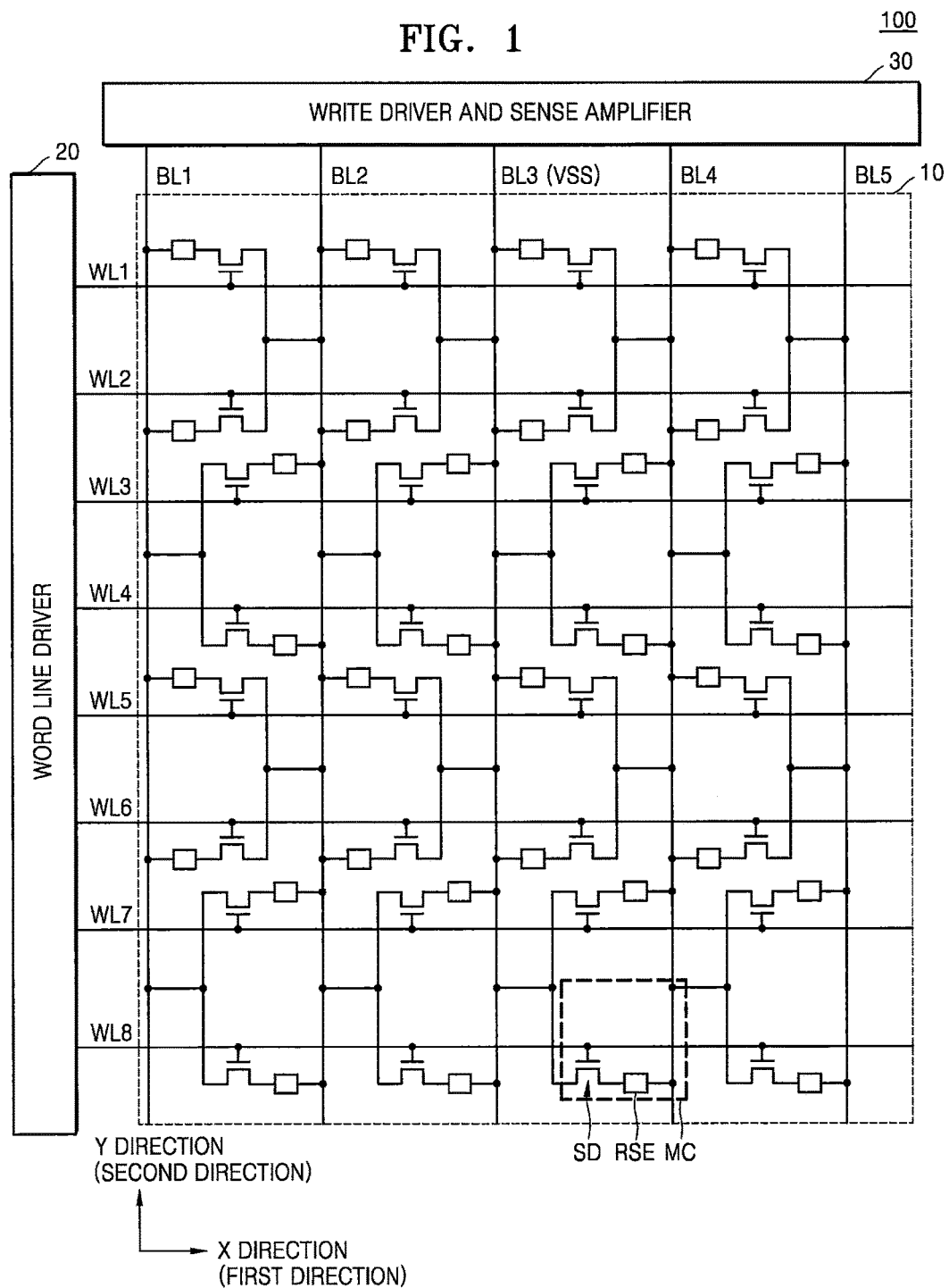
FIG. 1 is a circuit diagram illustrating a variable resistance memory device according to some embodiments of the present inventive concepts.

FIG. 1 is a circuit diagram illustrating a variable resistance memory device 100 according to some embodiments of the present inventive concepts.

In detail, the variable resistance memory device 100 may include a memory cell array 10, a word line driver region 20, and a write driver and sense amplifying (i.e., sense amplifier) region 30. The memory cell array 10 may include a plurality of memory cells MC arranged in a matrix. Each of the memory cells MC may include a switching device SD and a resistance sensing element RSE.

The memory cell array 10 may include a plurality of word lines WL1 to WL8 and a plurality of bit lines BL1 to BL5. In the example provided by FIG. 1, only the first to eight word lines WL1 to WL8 and the first to fifth bit lines BL1 to BL5 are illustrated, for the sake of convenience. Additional word lines WL and/or additional bit lines BL may be included in the memory cell array 10. The memory cell MC illustrated in FIG. 1 may be electrically connected to the word line WL8 among the word lines WL1 to WL8 and the bit line BL4 among the bit lines BL1 to BL5.

The resistance sensing element RSE may include a material layer of which a resistance value changes. The resistance sensing element RSE may have a resistance value corresponding to a data value. For example, when the resistance sensing element RSE has a lower resistance value than a predetermined reference resistance value, the resistance sensing element RSE may store data "0".

In contrast, when the resistance sensing element RSE has a higher resistance value than the predetermined reference resistance value, the resistance sensing element RSE may store data "1". Here, the data items "0" and "1" in accordance with the resistance value are provided as examples and may be reversed.

According to some embodiments, the resistance sensing element RSE may include a magnetic body. The resistance sensing element RSE may include a magnetic resistance memory having a magnetic tunnel junction (MTJ) structure. The resistance sensing element RSE may perform a memory function by using a spin transfer torque (STT) phenomenon in which a magnetizing direction of the magnetic body varies in accordance with input current. In this case, the variable resistance memory device 100 may be a magnetic memory device (e.g., a magneto-resistive random access memory (MRAM)).

According to some embodiments, the resistance sensing element RSE may have a phase change material layer that is in a crystal state or an amorphous state in accordance with current that flows among the bit lines BL1 to BL5. In this case, the variable resistance memory device 100 may be a phase change memory device (a phase change random access memory (PRAM)).

According to some embodiments, the resistance sensing element RSE may have a variable resistance layer of which electric resistance varies in accordance with oxygen vacancy or oxygen movement. In this case, the variable resistance memory element 100 may be a resistance/resistive memory device (e.g., a resistive random access memory (ReRAM)).

The switching device SD may be an access transistor or a cell transistor. The switching device SD illustrated in FIG. 1 is turned on or off in accordance with a voltage of the word line WL8. When the switching device SD is turned on, current may flow among the bit line BL4, the resistance sensing element RSE, and the bit line BL3 adjacent to the bit line BL4 and data may be recorded in or read from the resistance sensing element RSE.

The word lines WL1 to WL8 are spaced apart from each other in a second direction (a Y direction) and may extend in parallel in a first direction (an X direction). The word lines WL1 to WL8 may be driven by a word line driver in a word line driver region 20. The word line driver region 20 may extend in the second direction (the Y direction) of the memory cell array 10.

In order to select one word line WL8 among the word lines WL1 to WL8, the word line driver may output a voltage for turning on the switching device SD to the corresponding word line WL8. The second direction (the Y direction) is different from the first direction (the X direction) and, for example, may form a right angle with the first direction (the X direction).

The bit lines BL1 to BL5 may be connected to a write driver and sense amplifying region 30 that extends in the first direction of the memory cell array 10. A plurality of bit line drivers for driving the bit lines BL1 to BL5 may be arranged in the write driver and sense amplifying region 30. In addition, sense amplifiers electrically connected to the bit lines BL1 to BL5 may be arranged in the write driver and sense amplifying region 30.

Resistance sensing elements RSE of a plurality of (e.g., two) memory cells MC and switching elements SD of the plurality of (e.g., two) memory cells MC may be alternately connected to the bit lines BL1 to BL5 in the second direction. Two memory cells MC may be connected to adjacent ones of the bit lines BL1 to BL5. The switching elements SD of the two memory cells MC may be connected to one bit line (e.g., the first bit line BL1) and the resistance sensing elements RSE of the two memory cells MC may be connected to another bit line (e.g., the bit line BL2). The memory cell array 10 will be described in more detail with reference to FIGS. 2 to 4.

Figure 2:
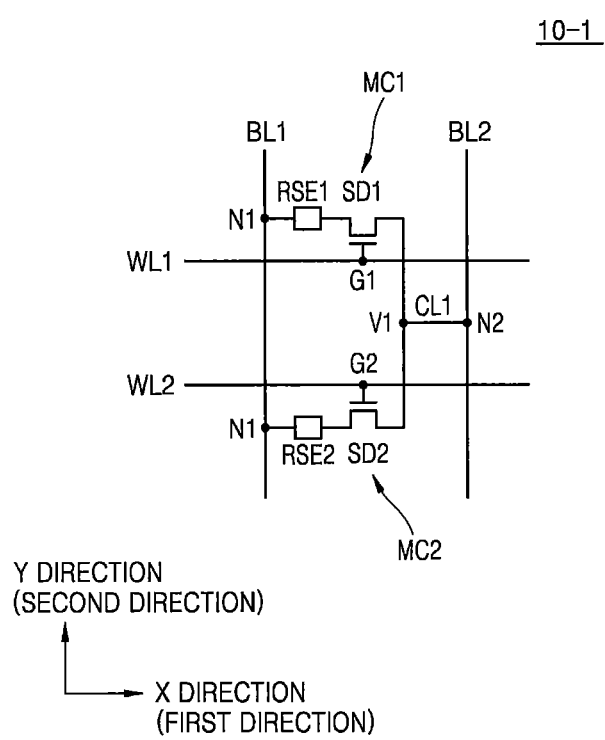
FIG. 2 is a partial detailed view illustrating a memory cell array of the variable resistance memory device of FIG. 1.

FIG. 2 is a partial detailed view illustrating a memory cell array 10-1 of the variable resistance memory device of FIG. 1.

In detail, the memory cell array 10-1 may include a plurality of memory cells MC1 and MC2, a plurality of word lines WL1 and WL2, and a plurality of bit lines BL1 and BL2. The memory cells MC1 and MC2 may respectively include switching devices SD1 and SD2 and resistance sensing elements RSE1 and RSE2 serially connected (i.e., connected in series) to the switching devices SD1 and SD2.

The word lines WL1 and WL2 are separate from each other in the second direction (the Y direction) and may extend in the first direction (the X direction). The word lines WL1 and WL2 may be electrically connected to the switching devices SD1 and SD2 and gates G1 and G2.

The bit lines BL1 and BL2 may be separate from each other in the first direction (the X direction) and may extend in the second direction (the Y direction). The bit lines BL1 and BL2 may be divided into the first bit line BL1 and the second bit line BL2. The first bit line BL1 and the second bit line BL2 may be positioned at the same height (level) from a substrate. The first bit line BL1 may be adjacent to the second bit line BL2. The second bit line BL2 may adjacent to the first bit line BL1. Here, the second bit line BL2 is set to be adjacent to the first bit line BL1 and further description will be given.

A first connection node N1 of the first bit line BL1 may be electrically connected to the resistance sensing elements RSE1 and RSE2 of the plurality of (e.g., two) memory cells MC1 and MC2. A second connection node N2 of the second bit line BL2 may be electrically connected to the switching devices SD1 and SD2 of the plurality of (e.g., two) memory cells MC1 and MC2.

The second connection node N2 of the second bit line BL2 may be electrically connected to the switching devices SD1 and SD2 of the plurality of memory cells MC1 and MC2 through a first conductive line CL1 and a first via V1. The first conductive line CL1 and the first via V1 may be positioned at a smaller (i.e., lower) height (level) than the first bit line BL1 and the second bit line BL2 from a substrate that has the first conductive line CL1, the first via V1, the first bit line BL1, and the second bit line BL2 thereon. Accordingly, the first conductive line CL1 and the first via V1 may be closer than the first bit line BL1 and the second bit line BL2 to a surface of the substrate.

In the memory cell array 10-1 configured as described above, when one of the switching devices SD1 and SD2 is turned on, current may flow among the first bit line BL1, the resistance sensing elements RSE1 and RSE2, and the second bit line BL2 adjacent to the first bit line BL1. Therefore, the memory cell array 10-1 may record data in the resistance sensing elements RSE1 and RSE2 or may read data from the resistance sensing elements RSE1 and RSE2.

In the memory cell array 10-1, a source line is not used but the first bit line BL1 and the second bit line BL2 positioned in an upper part are used, and widths of the first bit line BL1 and the second bit line BL2 may therefore be large. Therefore, in the memory cell array 10-1, during an operation of the variable resistance memory device 100, parasitic resistances of the first bit line BL1 and the second bit line BL2 may be reduced. Accordingly, the memory cell array 10-1 may be free of any source line, and thus may have improved electrical characteristics.

Figure 3:
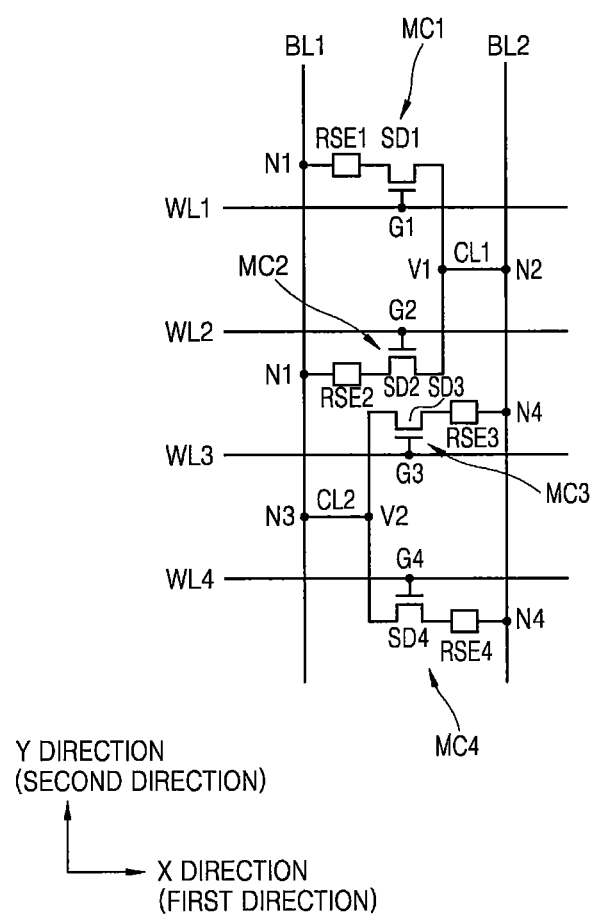
FIG. 3 is a partial detailed view illustrating a memory cell array of the variable resistance memory device of FIG. 1.

FIG. 3 is a partial detailed view illustrating a memory cell array 10-2 of the variable resistance memory device of FIG. 1.

In detail, memory cells MC3 and MC4 are added to the memory cell array 10-2 of FIG. 3 in comparison with the memory cell array 10-1 of FIG. 2. In FIG. 3, features similar to those of FIG. 2 may be described simply and/or repeated descriptions thereof may be omitted.

The memory cell array 10-2 of the variable resistance memory device 100 may include a plurality of memory cells MC1, MC2, MC3, and MC4, a plurality of word lines WL1 to WL4, and a plurality of bit lines BL1 and BL2. The memory cells MC1, MC2, MC3, and MC4 may respectively include switching devices SD1, SD2, SD3, and SD4 and resistance sensing elements RSE1, RSE2, RSE3, and RSE4 serially connected to the switching devices SD1, SD2, SD3, and SD4.

The word lines WL1 to WL4 are separate from each other in the second direction (the Y direction) and may extend in the first direction (the X direction). The word lines WL1 to WL4 may be electrically connected to gates G1, G2, G3, and G4 of the switching devices SD1, SD2, SD3, and SD4.

The bit lines BL1 and BL2 are separate from each other in the first direction (the X direction) and may extend in the second direction (the Y direction). The bit lines BL1 and BL2 may be divided into the first bit line BL1 and the second bit line BL2. The first bit line BL1 and the second bit line BL2 may be positioned at the same height (level) from a substrate. The first bit line BL1 may be adjacent to the second bit line BL2. The second bit line BL2 may be adjacent to the first bit line BL1. Here, the second bit line BL2 is set to be adjacent to the first bit line BL1 and further description will be made.

The first connection node N1 of the first bit line BL1 may be electrically connected to the resistance sensing elements RSE1 and RSE2 of the plurality of (e.g., two) memory cells MC1 and MC2.

Furthermore, a portion of the first bit line BL1 may be separate/spaced apart from the first connection node N1 and may include a third connection node N3. The third connection node N3 may be electrically connected to the switching devices SD3 and SD4 of the plurality of memory cells MC3 and MC4.

The third connection node N3 of the first bit line BL1 may be electrically connected to the switching devices SD3 and SD4 of the plurality of memory cells MC3 and MC4 through a second conductive line CL2 and a second via V2. The second conductive line CL2 and the second via V2 may be positioned at a smaller (i.e., lower) height (level) than the first bit line BL1 and the second bit line BL2 from the substrate.

The second connection node N2 of the second bit line BL2 may be electrically connected to the switching devices SD1 and SD2 of the plurality of (e.g., two) memory cells MC1 and MC2. The second connection node N2 of the second bit line BL2 may be electrically connected to the switching devices SD1 and SD2 of the plurality of memory cells MC1 and MC2 through the first conductive line CL1 and the first via V1. The first conductive line CL1 and the first via V1 may be positioned at a smaller (i.e., lower) height (level) than the first bit line BL1 and the second bit line BL2 from the substrate.

Furthermore, a portion the second bit line BL2 may be separate/spaced apart from the second connection node N2 and may include a fourth connection node N4. The fourth connection node N4 may be electrically connected to the resistance sensing elements RSE3 and RSE4 of the plurality of memory cells MC3 and MC4.

On the other hand, in terms of the memory cells MC1 and MC2, the first connection node N1 of the first bit line BL1 is connected to the resistance sensing elements RSE1 and RSE2 of the plurality of memory cells MC1 and MC2 and the second connection node N2 of the second bit line BL2 may be electrically connected to the switching devices SD1 and SD2 of the plurality of memory cells MC1 and MC2.

In terms of the memory cells MC3 and MC4, the third connection node N3 of the first bit line BL1 is connected to the switching devices SD3 and SD4 of the plurality of memory cells MC3 and MC4 and the fourth connection node N4 of the second bit line BL2 may be electrically connected to the resistance sensing elements RSE3 and RSE4 of the plurality of memory cells MC3 and MC4.

In terms of the memory cells MC1, MC2, MC3, and MC4, the resistance sensing elements RSE1 and RSE2 of the plurality of memory cells MCI and MC2 and the switching devices SD3 and SD4 of the plurality of memory cells MC3 and MC4 may be sequentially connected to (e.g., connected to different, adjacent nodes of) the first bit line BL1 that extends in the second direction. The switching devices SD1 and SD2 of the plurality of memory cells MC1 and MC2 and the resistance sensing electrodes RSE3 and RSE4 of the plurality of memory cells MC3 and MC4 may be sequentially connected to (e.g., connected to different, adjacent nodes of) the second bit line BL2 that extends in the second direction.

In the memory cell array 10-2 configured as described above, when one of the switching devices SD1, SD2, SD3, and SD4 is turned on, current may flow through the first bit line BL1, the resistance sensing elements RSE1, RSE2, RSE3, and RSE4, and the second bit line BL2 adjacent to the first bit line BL1. Therefore, the memory cell array 10-2 may record data in the resistance sensing elements RSE1, RSE2, RSE3, and RSE4 or may read data from the resistance sensing elements RSE1, RSE2, RSE3, and RSE4.

In the memory cell array 10-2, like in the memory cell array 10-1 of FIG. 1, since a source line is not used (e.g., is absent/omitted from the memory cell array 10-2), the widths of the first bit line BL1 and the second bit line BL2 may be large. Therefore, in the memory cell array 10-2, during an operation of the variable resistance memory device 100, parasitic resistances of the first bit line BL1 and the second bit line BL2 may be reduced.

Figure 4:
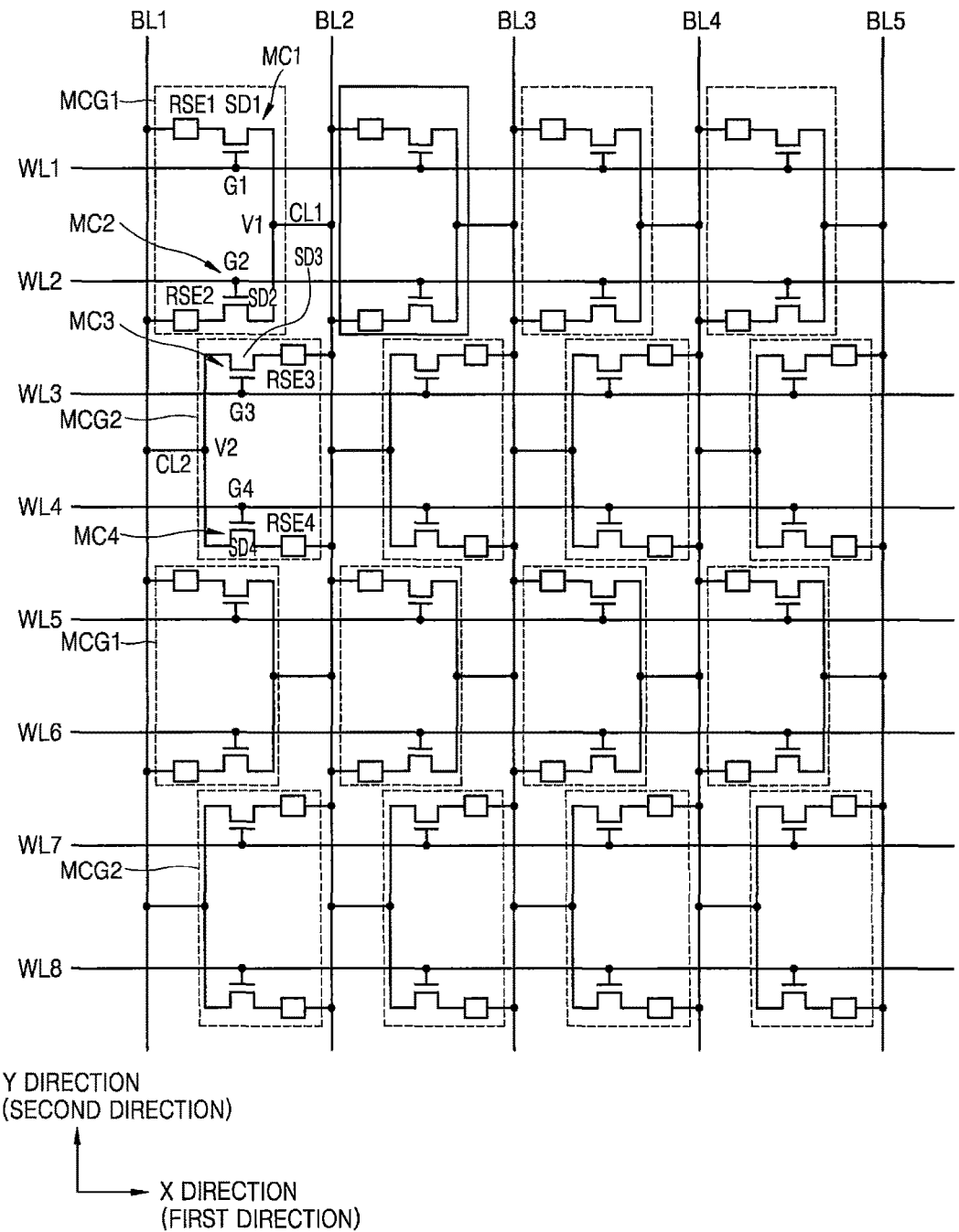
FIG. 4 is a partial detailed view illustrating a memory cell array of the variable resistance memory device of FIG. 1.

FIG. 4 is a partial detailed view illustrating a memory cell array 10-3 of the variable resistance memory device of FIG. 1.

In detail, in comparison with the memory cell array 10-2 of FIG. 3, the memory cell array 10-3 of FIG. 4 includes a plurality of first memory cell groups MCG1 each including the memory cells MCI and MC2 and a plurality of second memory cell groups MCG2 each including the memory cells MC3 and MC4. In FIG. 4, the same content as FIG. 3 may be described simply and/or repeated descriptions thereof may be omitted.

The memory cell array 10-3 includes the plurality of first memory cell groups MCG1, the plurality of second memory cell groups MCG2, the plurality of word lines WL1 to WL8, and the plurality of bit lines BL1 through BL5.

The first memory cell groups MCG1 are separated/spaced apart from each other in the first direction (the X direction) and the second direction (the Y direction). As described in FIG. 3, each of the first memory cell groups MCG1 includes the plurality of memory cells MC1 and MC2 including the resistance sensing elements RSE1 and RSE2 serially connected to the switching devices SD1 and SD2. The switching devices SD1 and SD2 of the memory cells MC1 and MC2 of the first memory cell group MCG1 are electrically connected to each other.

The second memory cell groups MCG2 are arranged between the first memory cell groups MCG1 and are separate from each other in the first direction. As described in FIG. 3, each of the second memory cell groups MCG2 includes the plurality of memory cells MC3 and MC4 including the resistance sensing elements RSE3 and RSE4 serially connected to the switching devices SD3 and SD4. The switching devices SD3 and SD4 of the memory cells MC3 and MC4 of the second memory cell group MCG2 are electrically connected to each other.

The word lines WL1 to WL5 are separated from each other in the second direction and extend in the first direction. The word lines WL1 to WL5 are electrically connected to the gates G1, G2, G3, and G4 of the switching devices SD1, SD2, SD3, and SD4 of the first memory cell groups MCG1 and the second memory cell groups MCG2.

The bit lines BL1 to BL5 are separated/spaced part from each other in the first direction and extend in the second direction. The bit lines BL1 to BL5 may be positioned at the same height (level) from the substrate. The bit lines BL1 to BL5 may be divided into bit lines and bit lines adjacent to the bit lines.

For example, the second bit line BL2 may be adjacent to the first bit line BL1 and the third bit line BL3 may be adjacent to the second bit line BL2. Here, representatively, the second bit line BL2 is set to be adjacent to the first bit line BL1 and description will be made by using the first bit line BL1 and the second bit line BL2.

The first bit line BL1 is electrically connected to the resistance sensing elements RSE1 and RSE2 of the first memory cell groups MCG1 and is electrically connected to the switching devices SD3 and SD4 of the second memory cell groups MCG2.

The plurality of first memory cell groups MCG1 and the plurality of second memory cell groups MCG2 may be alternately arranged along the first bit line BL1 in the second direction (the Y direction). The first bit line BL1 may be electrically connected to the switching devices SD3 and SD4 of the second memory cell groups MCG2 through the second conductive line CL2 and the second via V2.

The second bit line BL2 is electrically connected to the switching devices SD1 and SD2 of the first memory cell groups MCG1 and is electrically connected to the resistance sensing elements RSE3 and RSE4 of the second memory cell groups MCG2. The plurality of first memory cell groups MCG1 and the plurality of second memory cell groups MCG2 may be alternately arranged along the second bit line BL2 in the second direction. The second bit line BL2 may be electrically connected to the switching devices SD1 and SD2 of the first memory cell groups MCG1 through the first conductive line CL1 and the first via V1.

The first memory cell groups MCG1 and the second memory cell groups MCG2 may be arranged in a zigzag pattern along the second bit line BL2 in the second direction. For example, the resistance sensing elements RSE3 and RSE4 of the second memory cell groups MCG2 may be closer than the switching devices SD1 and SD2 of the first memory cell groups MCG1 to the second bit line BL2. The switching devices SD1 and SD2 of the first memory cell groups MCG1 connected to the first bit line BL1 may be electrically connected to the second bit line BL2 between the resistance sensing elements RSE1 and RSE2 of the first memory cell groups MCG1 connected to the second bit line BL2.

In the memory cell array 10-3, like in the memory cell array 10-2 of FIG. 3, since a source line is not used (e.g., is absent/omitted from the memory cell array 10-3), widths of the bit lines BL1 and BL5 may be large. Therefore, in the memory cell array 10-3, parasitic resistances of the bit lines BL1 to BL5 may be reduced during the operation of the variable resistance memory device 100.

Figure 5:
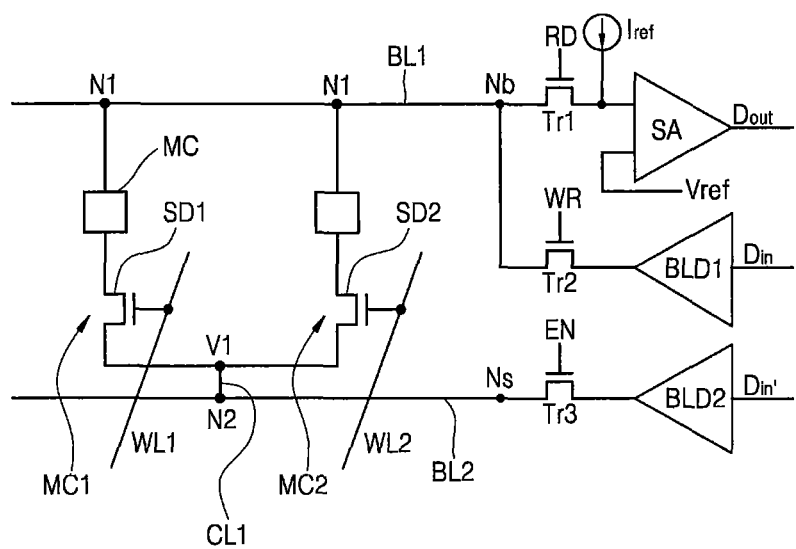
FIG. 5 is a circuit diagram illustrating an operation of the memory cell array of FIG. 2.

FIG. 5 is a circuit diagram illustrating an operation of the memory cell array of FIG. 2.

In detail, in the memory cell array 10-1, the plurality of memory cells MC1 and MC2 may be arranged between the first bit line BL1 and the second bit line BL2. The switching devices SD1 and SD2 of the memory cells MC1 and MC2 may be connected to the word lines WL1 and WL2, respectively. The first connection node N1 formed in/at the first bit line BL1 may be connected to the resistance sensing elements RSE1 and RSE2 of the memory cells MC1 and MC2.

The second connection node N2 formed in/at the second bit line BL2 may be connected to the switching devices SD1 and SD2 of the memory cells MC1 and MC2. The second bit line BL2 may be connected to the switching devices SD1 and SD2 of the memory cells MC1 and MC2 through the first conductive line CL1 and the first via V1.

The first bit line BL1 may be connected to a first bit line driver BLD1 and a sense amplifier SA through a connection node Nb. The second bit line BL2 may be connected to a second bit line driver BLD2 through a connection node Ns.

The first bit line driver BLD1, the sense amplifier SA, and the second bit line driver BLD2 may be arranged in the write driver and sense amplifying region 30 of FIG. 1. A circuit positioned on the right side of the connection node Nb and the connection node Ns may be arranged in the write driver and sense amplifying region 30. The left side of the connection node Nb and the connection node Ns may correspond to the memory cell array 10.

A transistor Tr2 controlled by a write signal WR may be connected between the connection node Nb of the first bit line BL1 and the first bit line driver BLD1. The write signal WR may have a turn-on level when data is recorded in one of the memory cells MC1 and MC2.

A transistor Tr1 controlled by a read signal RD may be connected between the connection node Nb of the first bit line BL1 and the sense amplifier SA. The read signal RD may have a turn-on level when data is read from one of the memory cells MC1 and MC2. A transistor Tr3 controlled by an enable signal EN may be connected between the connection node Ns of the second bit line BL2 and the second bit line driver BLD2. The enable signal EN may have a turn-on level when one of the write signal WR and the read signal RD has a turn-on level.

Input data Din may be applied to an input end of the first bit line driver BLD1. Inverted input data Din' may be input to an input end of the second bit line driver BLD2. For example, the bit line driver BLD1 may output a high voltage when the input data Din is "1" and may output a low voltage when the input data Din is "0".

In contrast, the second bit line driver BLD2 may output a low voltage when the input data Din is, for example, "1" and may output a high voltage when the input data Din is, for example, "0". The high voltage may be, for example, 1.2V and the low voltage may be, for example, 0V. However, the values of the high voltage and the low voltage are provided as examples, and the high voltage and the low voltage are not limited thereto.

A reference voltage Vref and the first bit line BL1 may be connected to an input end of the sense amplifier SA. The sense amplifier SA may output, for example, "1" as output data Dout when a voltage of the first bit line BL1 is higher than the reference voltage Vref and may output, for example, "0" when the voltage of the first bit line BL1 is lower than the reference voltage Vref. Alternatively, the sense amplifier SA may output "0" when the voltage of the first bit line BL1 is higher than the reference voltage Vref and may output "1" when the voltage of the first bit line BL1 is lower than the reference voltage Vref.

Reference current Iref may be applied to the first bit line BL1. The reference current Iref may be applied to the first bit line BL1 when the read signal RD has the turn-on level. The reference current Iref flows through a current path that passes through the selected memory cells MC1 and MC2. At the input end of the sense amplifier SA, a value of the voltage of the first bit line BL1 may be determined by adding multiplication of the entire resistance on the current path and the reference current Iref to the voltage of the second bit line BL2.

For example, when the resistances of the selected memory cells MC1 and MC2 are large, the voltage of the first bit line BL1 is higher than the reference voltage Vref and, when the resistances of the resistance sensing elements RSE1 and RSE2 of the memory cells MC1 and MC2 are small, the voltage of the first bit line BL1 may be lower than the reference voltage Vref.

The entire resistance on the current path may include resistances of the resistance sensing elements RSE1 and RSE2 of the selected memory cells MC1 and MC2 and parasitic resistances around the selected memory cells MC1 and MC2. The parasitic resistances include a resistance of the first bit line BL1 between the selected memory cells MC1 and MC2 and the sense amplifier SA, a resistance of the second bit line BL2 between the selected memory cells MC1 and MC2 and the second bit line driver BLD2, a contact resistance, and turn-on resistances of transistors.

As described above, the memory cell array 10-1 records data in or reads data from the memory cells MC1 and MC2 by using the first bit line BL1 and the second bit line BL2. Therefore, in the memory cell array 10-1, since a source line is not used (e.g., is absent/omitted) but the first bit line BL1 and the second bit line BL2 positioned in an upper part are used, the widths of the first bit line BL1 and the second bit line BL2 may be large. Therefore, in the memory cell array 10-1, parasitic resistances of the first bit line BL1 and the second bit line BL2 may be reduced.

Therefore, it may be possible to inhibit/prevent the voltage of the first bit line BL1 sensed by the sense amplifier SA from being higher than the reference voltage Vref although the resistances of the resistance sensing elements RSE1 and RSE2 of the selected memory cells MC1 and MC2 are small due to parasitic resistances of the first bit line BL1 and the second bit line BL2. In order to inhibit/prevent the voltage of the first bit line BL1 from being higher than the reference voltage Vref, it may be possible to reduce a margin of a voltage detected from the first bit line BL1 so that an operation voltage may be reduced. In the example described with respect to FIG. 5, the voltage is detected from the first bit line BL1. However, a voltage may be detected from the second bit line BL2.

In FIGS. 1 to 5, a circuit diagram of a memory cell array according to some embodiments of the present inventive concepts is illustrated as an example. The present inventive concepts are not limited thereto.

Figure 6:
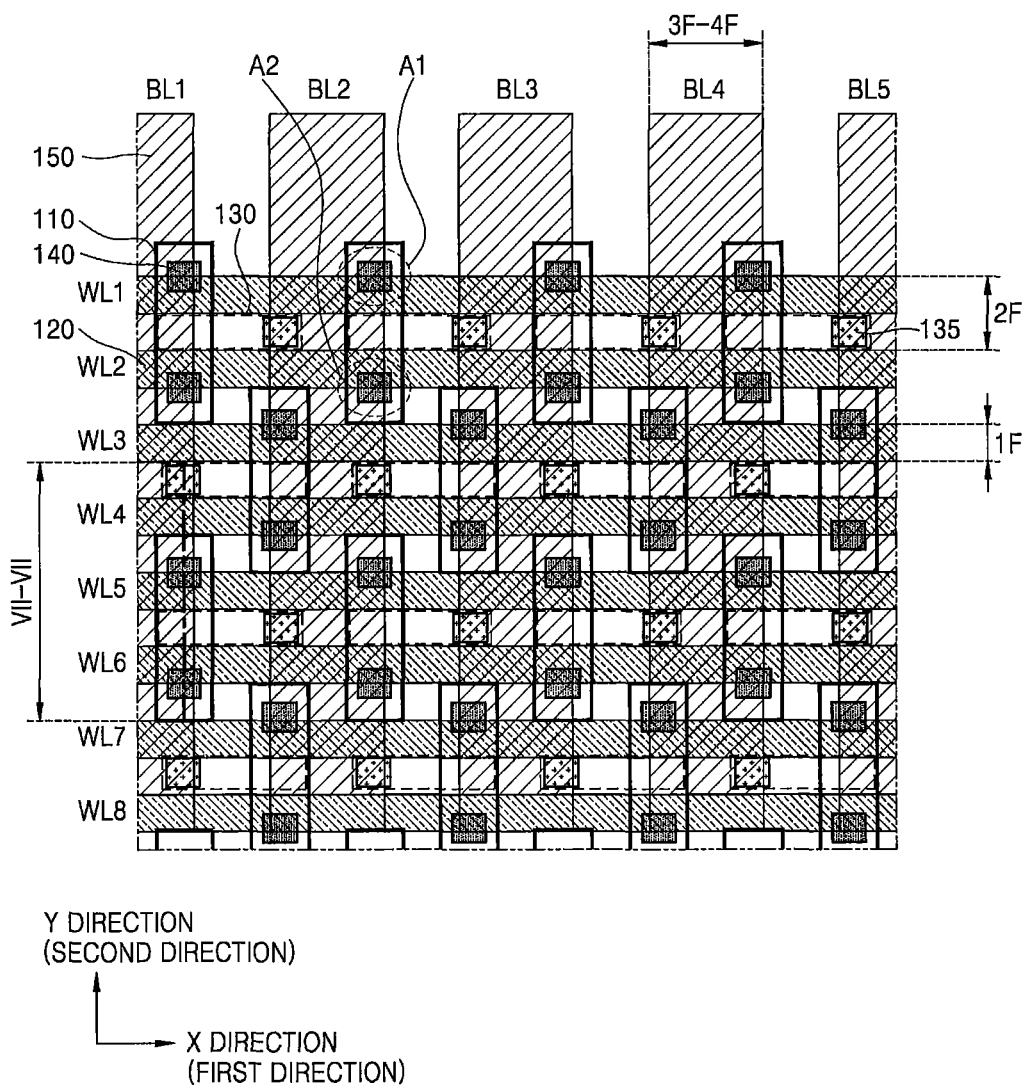
FIG. 6 is a layout diagram illustrating a variable resistance memory device according to some embodiments of the present inventive concepts.

FIG. 6 is a layout diagram illustrating a variable resistance memory device according to some embodiments of the present inventive concepts.

In detail, FIG. 6 may correspond to the memory cell array 10 of the variable resistance memory device 100 of FIG. 1. The variable resistance memory device 100 may include a plurality of memory cells (MC of FIG. 1) arranged in a matrix. The variable resistance memory device 100 may include active regions 110, word lines 120 (WL1 to WL8), vias 135, conductive lines 130, resistance sensing elements 140 (RSE of FIG. 1), and bit lines 150 (BL1 to BL5).

The active regions 110 may be defined on a substrate by a device isolation layer. The active regions 110 may be arranged to extend in the second direction (the Y direction). The first region A1 and the second region A2 may be provided at both (i.e., opposite) ends of the active region 110. The first region A1 and the second region A2 may partially overlap the word line 120. The first region A1 and the second region A2 may be source or drain regions of a transistor. The first region A1 and the second region A2 may be connected to the bit line 150 through the resistance sensing elements 140.

The plurality of active regions 110 may be arranged in a zigzag pattern in the second direction. The active regions 110 may be arranged in parallel in the first direction (the X direction) and the second direction (the Y direction). Each active region 110 may be formed of a semiconductor material layer that forms a substrate or a semiconductor material layer additionally formed on the substrate. For example, the active region 110 may be formed of a silicon layer formed on the substrate through deposition or epitaxial growth. The silicon layer may be, for example, a single crystalline silicon layer or a poly-silicon layer.

The word lines 120 extend in the first direction (the X direction) and may run parallel with each other in the second direction (the Y direction). The word lines 120 may be arranged across the active regions 110 arranged in the second direction (the Y direction). The word lines 120 may include at least one of a doped semiconductor, a metal, a conductive metal nitride, and/or a metal-semiconductor compound. A width of the word line 120 is 1 F and a pitch between the word lines 120 in the second direction (the Y direction) may be 2 F. Here, F may mean a smallest/minimum lithographic feature size.

The resistance sensing elements 140 may be arranged in the first direction (the X direction) and the second direction (the Y direction) to correspond to the first region A1 and the second direction A2 of the active region 110. The resistance sensing elements 140 are arranged between the bit line 150 and the first region A1 and the second region A2 of the active region 110 and may be connected to the first region A1 and the second region A2 of the active region 110 as well as the bit line 150. The resistance sensing elements 140 will be described in detail herein.

The bit lines 150 extend in the second direction (the Y direction) and may run parallel with each other in the first direction (the X direction). Each of the bit lines 150 is electrically connected to the first region A1 and the second region A2 of a plurality of the active regions 110 and may overlap parts of the first region A1 and the second region A2. Each of the bit lines 150 may be electrically connected to the first region A1 and the second region A2 of the active region 110 through the resistance sensing elements 140.

The two resistance sensing elements 140 are arranged in the active region 110 under the bit line 150. Furthermore, when the active regions 110 are alternately arranged in the second direction (the Y direction) so that one word line and one bit line are selected, only one resistance sensing element 140 may be selected, which will be described in detail herein.

Each bit line 150 may include at least one of metal, a conductive metal nitride, a metal-semiconductor compound, and/or a doped semiconductor. The width of the bit line 150 may be 3 F to 4 F in the first direction (the X direction). As described above, according to the present inventive concepts, since a source line is not used (e.g., is absent/omitted from the memory cell array 10), the width of the bit line 150 may be 3 F to 4 F. For example, in some embodiments, the width of the bit line 150 may be 4 F. That is, according to the present inventive concepts, since the source line is not used, the width of the bit line 150 may be relatively large.

The bit lines 150 may be connected to each other through the conductive lines 130 and the vias 135. For example, the bit lines 150 and BL1 may be electrically connected to the adjacent bit lines 150 and BL2 through the conductive line 130 and the via 135.

Figure 7:
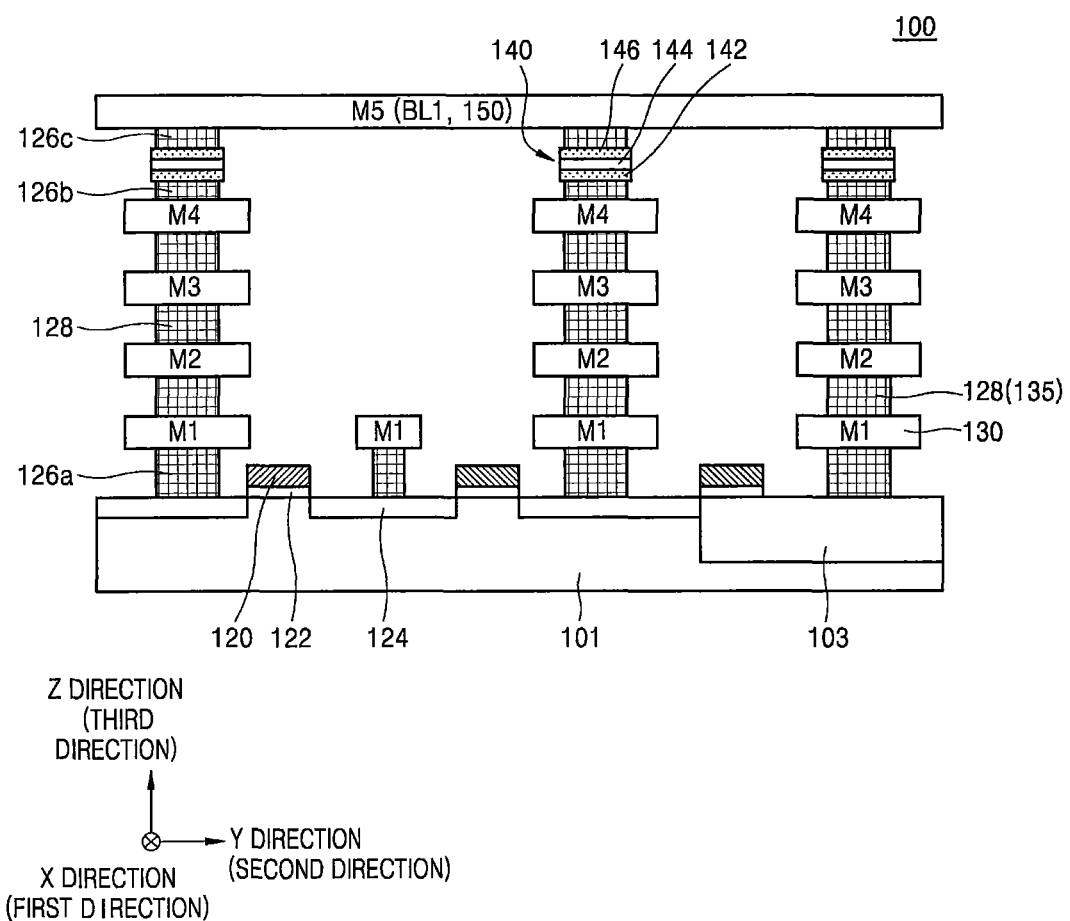
FIG. 7 is a cross-sectional view taken along line VII-VII of FIG. 6.

FIG. 7 is a cross-sectional view taken along the line VII-VII of FIG. 6.

In detail, the variable resistance memory device 100 may include a substrate 101 in which a device isolation layer 103 is formed. The active regions (110 of FIG. 6) that extend to run parallel may be defined by the device isolation layer 103 on the substrate 101 in the first direction (the X direction).

The substrate 101 may be formed of a semiconductor material. In some embodiments, the substrate 101 may include silicon (Si). In some embodiments, the substrate 101 may include a semiconductor element such as germanium (Ge) or a compound semiconductor material such as silicon carbide (SiC), gallium arsenide (GaAs), an indium arsenide (InAs), or indium phosphide (InP).

In some embodiments, the substrate 101 may have a silicon on insulator (SOI) structure. For example, the substrate 101 may include a buried oxide layer (BOX). In some embodiments, the substrate 101 may include a conductive region, for example, a well doped with impurities or a structure doped with impurities.

The word lines 120 may extend on the active regions 110 in the first direction (the X direction). The word lines 120 may be arranged to run parallel in the first direction (the X direction) by a predetermined distance, for example, with a pitch of 2 F.

The word lines 120 are formed to have upper surfaces at a higher level than an upper surface of the substrate 101. However, the word lines 120 may be buried in the substrate 101. In some embodiments, the word line 120 may include at least one material among a doped semiconductor, a metal, a conductive metal nitride, and/or a metal-semiconductor compound.

On the substrate 101, a gate dielectric layer 122 for insulating the plurality of word lines 120 from the substrate 101 may be formed. In some embodiments, the gate dielectric layer 122 may be formed of at least one among a silicon oxide layer, a silicon nitride layer, a silicon oxynitride layer, oxide/nitride/oxide (ONO), and/or a high-k dielectric film having a larger dielectric constant than the silicon oxide layer.

A source or drain region 124 may be formed on the substrate 101. First contact plugs 126a may be formed on an upper surface of the substrate 101 and the device isolation layer 103 in regions in which the source or drain region 124 or the vias 135 are to be formed. The first contact plugs 126a may be formed of one of various columns such as a cylindrical column, a square column, a pentagonal column, or an elliptical column. In addition, the first contact plug 126a may be thinner toward a lower part so that a diameter of an upper part is larger than a diameter of the lower part. Accordingly, the first contact plug 126a may have a tapered width.

Multilayer metal interconnect layers M1 to M4 may be arranged on the first contact plugs 126a. According to some embodiments, as illustrated in FIG. 7, the metal interconnect layers M1 to M4 are formed of first to fourth metal interconnect layers M1 to M4, that is, to provide a four-layer metal interconnect layer. However, the present inventive concepts are not limited thereto. The metal interconnect layers M1 to M4 may be electrically connected to each other by using vias 128.

Resistance sensing elements 140 electrically connected to each other through a second contact plug may be arranged on the fourth metal interconnect (e.g., metal wiring) layer M4 formed on the source or drain region 124. The resistance sensing elements 140 may be connected to the source or drain region 124 through the first contact plug 126a and a second contact plug 126b.

The resistance sensing element 140 may store data in accordance with a resistance state. The resistance sensing element 140 may include an MTJ structure. For example, the resistance sensing element 140 may include a lower electrode 142, an upper electrode 146, and a variable resistance layer 144 arranged between the lower electrode 142 and the upper electrode 146. The variable resistance layer 144 may include, for example, a first magnetization layer, a tunnel barrier layer, and a second magnetization layer that are sequentially laminated. The resistance sensing element 140 will be described in more detail herein.

The bit line 150 may be electrically connected to an upper part of the resistance sensing element 140 through a third contact plug. The bit lines 150 extend in the second direction (the Y direction) and may run parallel with each other in the first direction (the X direction). The bit lines 150 may be electrically connected to the source or drain region 124 through the second contact plug 126b, the resistance sensing element 140, the metal interconnect layers M1 to M4, and the first contact plug 126a.

In some embodiments, the bit lines 150 may include at least one material among a metal, a conductive metal nitride, a metal-semiconductor compound, or a doped semiconductor. For example, the bit lines 150 may include a barrier layer formed of tantalum (Ta), titanium (Ti), TaN, TiN, or a combination of the above metals and a metal layer formed on the barrier layer, for example, a copper (Cu) layer.

As described above, a bit line 150 may be electrically connected to a neighboring bit line 150 through the conductive line 130 and the via 135 that are positioned on the device isolation layer 103. According to some embodiments, as illustrated in FIG. 7, the first metal interconnect layer M1 is used as the conductive line 130 for performing electric connection between the bit lines 150. However, in some embodiments, the second to fourth metal interconnect layers M2 to M4 may be used for such a connection. In FIG. 7, the contact plugs 126a to 126c, the word lines 120, and the metal interconnect layers M1 to M4 may be insulated from each other by an insulating layer. The insulating layer may be formed of an oxide layer, a nitride layer, or a combination of these layers.

Figure 8:
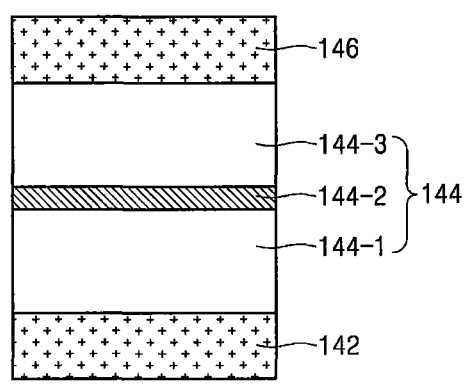
FIG. 8 is a cross-sectional view illustrating an example structure of the resistance sensing element of FIG. 7.

FIG. 8 is a cross-sectional view illustrating an example structure of the resistance sensing element of FIG. 7.

In detail, the resistance sensing element 140 may include a lower electrode 142, an upper electrode 146, and a variable resistance layer 144 including a first magnetization layer 144-1, a tunnel barrier layer 144-2, and a second magnetization layer 144-3 that are sequentially layered/laminated between the lower electrode 142 and the upper electrode 146. One of the first magnetization layer 144-1 and the second magnetization layer 144-3 includes a pinned layer and the other may include a free layer. However, the present inventive concepts are not limited thereto.

For example, the first magnetization layer 144-1 or the second magnetization layer 144-3 may include at least one pinned layer and at least one free layer. In addition, in FIG. 8, only one tunnel barrier 144-2 layer is included. However, the present inventive concepts are not limited thereto. A plurality of tunnel barrier layers may be included between the lower electrode 142 and the upper electrode 146.

In the pinned layer, a magnetization easy axis is provided to be perpendicular to a surface and a magnetization direction may be fixed. In the free layer, a magnetization easy axis is provided to be perpendicular to a surface and a magnetization direction may vary in accordance with a condition.

A resistance value of an MTJ of the resistance sensing element 140 may vary in accordance with magnetization directions of the first magnetization layer 144-1 and the second magnetization layer 144-3. For example, when the magnetization directions of the first magnetization layer 144-1 and the second magnetization layer 144-3 are antiparallel, the resistance sensing element 140 has a large resistance value and may store data '1'. When the magnetization directions of the first magnetization layer 144-1 and the second magnetization layer 144-3 are parallel, the resistance sensing element 140 has a small resistance value and may store data '0'. The data may be recorded in/read from the memory device by using a difference in resistance value.

In some embodiments, the resistance sensing element 140 may be used for implementing an MTJ device of a perpendicular magnetization method. In some embodiments, the magnetization direction of the free layer of the resistance sensing element 140 may change by a spin transfer torque (STT). In some embodiments, the resistance sensing element 140 may have a horizontal MTJ structure in which a movement direction of current and a magnetization easy axis are perpendicular to each other.

The lower electrode 142 and the upper electrode 146 may include a conductive material with small reactivity. In some embodiments, the lower electrode 142 and the upper electrode 146 may include a conductive metal nitride. For example, the lower electrode 142 and the upper electrode 146 may have a single layer structure formed of at least one material among Ti, Ta, ruthenium (Ru), TiN, TaN, or tungsten (W), or a multilayer structure including a plurality of materials.

The tunnel barrier layer 144-2 may have a smaller thickness than a spin diffusion distance. The tunnel barrier layer 144-2 may include a non-magnetic material. In some embodiments, the tunnel barrier layer 144-2 may be formed of an oxide of one among magnesium (Mg), Ti, aluminium (Al), magnesium zinc (MgZn), and magnesium boride (MgB). In some embodiments, the tunnel barrier layer 144-2 may be formed of a Ti nitride or a vanadium (V) nitride.

In some embodiments, at least one of the first magnetization layer 144-1 and the second magnetization layer 144-3 may include at least one among iron (Fe), cobalt (Co), nickel (Ni), palladium (Pd), or platinum (Pt). In some embodiments, at least one of the first magnetization layer 144-1 and the second magnetization layer 144-3 may be formed of a Co-M1 alloy (here, M1 is at least one metal among Pt, Pd, or Ni) or an Fe-M2 alloy (here, M2 is at least one metal among Pt, Pd, or Ni). In some embodiments, at least one of the first magnetization layer 144-1 and the second magnetization layer 144-3 may further include at least one material among boron (B), carbon (C), Cu, silver (Ag), gold (Au), ruthenium (Ru), Ta, or chromium (Cr).

In some embodiments, at least one of the first magnetization layer 144-1 and the second magnetization layer 144-3 may include a perpendicular magnetic anisotropy (PMA) material. In some embodiments, at least one of the first magnetization layer 144-1 and the second magnetization layer 144-3 may include a synthetic anti-ferromagnetic (SAF) structure. In the SAF structure, a Ru intermediate layer is inserted into a ferromagnetic lamination structure. For example, the SAF structure may have a multilayer structure of CoFeB/Ta/(Co/Pt)m/Ru/(Co/Pd)n (here, m and n are natural numbers). The SAF structure that may be used by the magnetic memory device according to the present inventive concepts is not limited thereto. Each of various modified structures may be used.

Figure 9:
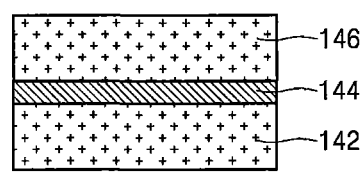
FIG. 9 is a cross-sectional view illustrating an example structure of the resistance sensing element of FIG. 7.

FIG. 9 is a cross-sectional view illustrating an example structure of the resistance sensing element of FIG. 7.

In detail, the resistance sensing element 140 may include the lower electrode 142, the upper electrode 146, and the variable resistance layer 144 between the lower electrode 142 and the upper electrode 146. The variable resistance layer 144 may include a phase change material layer. A phase state of the phase change material layer changes to a crystal state or an amorphous state in accordance with current that flows between the lower electrode 142 and the upper electrode 146 so a resistance may change. In this case, the variable resistance memory device 100 may be applied to a PRAM apparatus.

The lower electrode 142 is formed under the variable resistance layer 144 and heats the variable resistance layer 144 so that a phase change may occur in the variable resistance layer 144. The lower electrode 142 may include metal or a metal compound such as a metal nitride or a metal silicon nitride. For example, the lower electrode 142 may include a metal such as W, Al, Cu, Ta, Ti, molybdenum (Mo), niobium (Nb), or Zr, a metal nitride of these metals, or a metal silicon nitride of these metals. The metals may be singly used or may be combined with each other to be used.

The variable resistance layer 144 is formed on the lower electrode 142. A lower surface of the variable resistance layer 144 may have the same shape and area as an upper surface of the lower electrode 142. The variable resistance layer 144 may include a chalcogenide based material in which Ge, antimony (Sb) and/or tellurium (Te) are combined at a predetermined ratio. The variable resistance layer 144 may include Ge, Sb, Te, and at least one kind of impurities (X).

That is, in the variable resistance layer 144, one or more impurities selected from group III, group IV, group V, and group VI may be added to a Ge-Sb-Te system. In some example embodiments, a composition of the variable resistance layer 144 may be $X_a Ge_b Sb_c Te_{1-(a+b+c)}$. The impurities (X) may be selected from boron (B), C, nitrogen (N), oxygen (O), Al, Si, phosphorus (P), or sulfur (S). The impurities may be selected from C, N, and O. In some embodiments, the impurities may be bismuth (Bi).

The upper electrode 146 is formed to contact the variable resistance layer 144. The upper electrode 146 may include, for example, a material the same as or similar to the lower electrode 142.

According to some embodiments of the present inventive concepts, the resistance sensing element 140 may include the lower electrode 142, the upper electrode 146, and the variable resistance layer 144 between the lower electrode 142 and the upper electrode 146. The variable resistance layer 144 may include a material of which electric resistance changes by oxygen vacancy or oxygen movement. For example, the variable resistance memory device 100 may be applied to a ReRAM apparatus.

The variable resistance layer 144 may include a perovskite based material or a transition metal oxide. The perovskite base material may be, for example, STO(SrTiO$_3$), BTO(BaTiO$_3$), or PCMO(Pr1-XCaXMnO$_3$). The transition metal oxide may be, for example, a titanium oxide (TiOx), a zirconium oxide (ZrOx), an aluminium oxide (AlOx), a hafnium oxide (HfOx), a tantalum oxide (TaOx), a niobium oxide (NbOx), a cobalt oxide (CoOx), a tungsten oxide (WOx), a lanthanum oxide (LaOx), or a zinc oxide (ZnOx). The above oxides may be singly used or two or more oxides may be combined to be used.

The variable resistance layer 144 may have a structure in which a plurality of layers including the above materials are laminated. For example, the variable resistance layer 144 may have a structure in which a first hafnium oxide (HfO$_2$) layer, a second hafnium oxide (HfOx) layer, and a zirconium oxide (ZrOx) layer are laminated. The variable resistance layer 144 may have a structure in which a titanium aluminium oxide (TiAlOx) layer, a tantalum oxide (TaOx) layer, and an aluminium oxide (AlOx) layer are laminated.

Hereinafter, an example in which the memory cell of the variable resistance memory device according to various embodiments of the present inventive concepts is a magnetic resistance device will be described.

Figure 10:
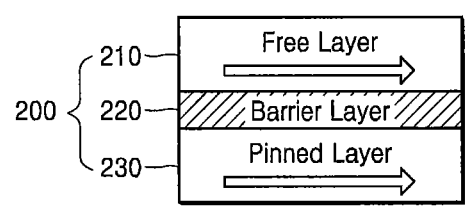
FIG. 10 is a cross-sectional view illustrating a magneto-resistance device included in a variable resistance memory device, according to various embodiments of the present inventive concepts.

FIG. 10 is a cross-sectional view illustrating a magnetic resistance device 200 included in a variable resistance memory device according to various embodiments of the present inventive concepts.

In detail, the magnetic resistance device 200 includes a free layer 210, a pinned layer 230, and a barrier layer 220 interposed between the free layer 210 and the pinned layer 230. The magnetic resistance device 200 may correspond to (e.g., may be) the resistance sensing element RSE of FIG. 1.

The free layer 210 has a magnetization easy axis perpendicular to a surface of the free layer 210 and a magnetization direction varies in accordance with a condition. The pinned layer 230 has a magnetization easy axis perpendicular to a surface of the pinned layer 230 and a magnetization direction is fixed. A resistance value of the magnetic resistance device 200 varies in accordance with the magnetization direction of the free layer 210. When the magnetization direction of the free layer 210 and the magnetization direction of the pinned layer 230 are parallel, the magnetic resistance device 200 has a small resistance value and may store data '0'. When the magnetization direction of the free layer 210 and the magnetization direction of the pinned layer 230 are anti-parallel, the magnetic resistance device 200 has a large resistance value and may store data '1'. Positions of the pinned layer 230 and the free layer 210 are not limited thereto, however, and the positions may be reversed. The data stored in the magnetic resistance device 200 in accordance with the magnetization direction of the free layer 210 may be reversed.

Each of the free layer 210 and the pinned layer 230 may have interface perpendicular magnetic anisotropy (IPMA) in an interface (that is, a contact surface) with the barrier layer 220. For this purpose, the free layer 210 and the pinned layer 230 may be formed of a ferromagnetic material. The ferromagnetic material may have high magnetic anisotropy energy Ku, for example, of about 106 to 107 erg/cc. The free layer 210 and the pinned layer 230 may have magnetization easy axes perpendicular to the interface due to the high magnetic anisotropy energy.

The free layer 210 is a magnetic layer having a changeable magnetization direction. That is, the free layer 210 may include a ferromagnetic material having a magnetic moment in which a magnetization direction freely changes with respect to a perpendicular direction, for example, at least one among Co, Fe, or Ni and may further include other elements such as B, Cr, Pt, or Pd. The free layer 210 may be formed of a material different from the pinned layer 230 or the same material as the pinned layer 230.

The pinned layer 230 is a magnetic layer having a fixed magnetization direction. The ferromagnetic material that forms the pinned layer 230 may include at least one among Co, Fe, or Ni and may further include other elements such as B, Cr, Pt, or Pd.

According to some embodiments, as illustrated in FIG. 10, the pinned layer 230 is illustrated as one single layer. However, the present inventive concepts are not limited thereto. The pinned layer 230 may have a multilayer structure. In some embodiments, the pinned layer 230 has a multilayer structure in which a first layer formed of at least one of Co or a Co alloy and a second layer formed of at least one of Pt, Ni, or Pd are alternately laminated, is a FePt layer or a CoPt layer having an L10 structure, or may be an alloy layer of a rare-earth element and transition metal. Here, the rare-earth element may be at least one of Ta or Gd and the transition metal may be at least one of Ni, Fe, or Co. Various combinations of alloys of rare-earth elements and transition metals may be used. Among the combinations, for example, CoFeB or CoFe may be used as a material of the pinned layer 230.

In order to increase a tunnel magnetoresistance ratio (TMR) of the magnetic resistance device 200, the barrier layer 220 is interposed between the free layer 210 and the pinned layer 230. The barrier layer 220 may have a smaller thickness than a spin diffusion distance. The barrier layer 220 may include a non-magnetic material. The barrier layer 220 may include at least one among, for example, Mg, Ti, Al, an MgZn oxide, an MgB oxide, a Ti nitride, or a V nitride. The barrier layer 220 may have, for example, a multilayer structure.

In some embodiments, the free layer 210, the barrier layer 220, and the pinned layer 230 may have the same crystal structure. For example, each of the free layer 210, the barrier layer 220, and the fixed layer 230 may have a body centered cubic (BCC) crystal structure.

Figure 11:
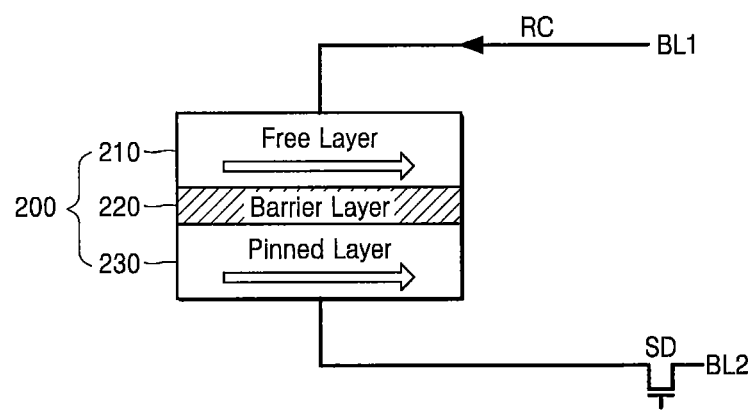
FIGS. 11 and 12 are views illustrating a read operation of data recorded in a magnetic resistance device included in a variable resistance memory device, according to various embodiments according to the present inventive concepts.
Figure 12:
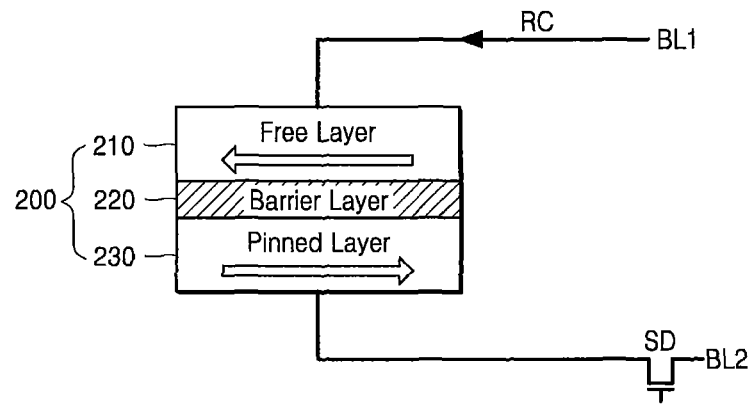

FIGS. 11 and 12 are views illustrating an operation of reading data recorded in a magnetic resistance device included in a variable resistance memory device according to various embodiments according to the present inventive concepts.

In detail, FIGS. 11 and 12 illustrate a magnetization direction in accordance with the data recorded in the magnetic resistance device 200. The resistance value of the magnetic resistance device 200 varies in accordance with the magnetization direction of the free layer 210. When a read current RC flows through the magnetic resistance device 200, a data voltage in accordance with the resistance value of the magnetic resistance device 200 is output. Since intensity of the read current RC is much smaller than intensity of a write current, the magnetization direction of the free layer 210 does not change due to the read current RC.

Referring to FIG. 11, in the magnetic resistance device 200, the magnetic direction of the free layer 210 and the magnetization direction of the pinned layer 230 run parallel with each other. Accordingly, the magnetic resistance device 200 has a small resistance value. In this case, when the read current RC flows through the bit line BL1, the data "0" may be read.

Referring to FIG. 12, in the magnetic resistance device 200, the magnetization direction of the free layer 210 and the magnetization direction of the pinned layer 230 are anti-parallel. Accordingly, the magnetic resistance device 200 has a large resistance value. In this case, when the read current RC flows through the bit line BL1, the data "1" may be read.

According to some embodiments, as illustrated in FIGS. 11 and 12, in the magnetic resistance device 200, the free layer 210 and the pinned layer 230 are illustrated as horizontal magnetic devices. However, according to some embodiments, the free layer 210 and the pinned layer 230 may be vertical magnetic devices.

Figure 13:
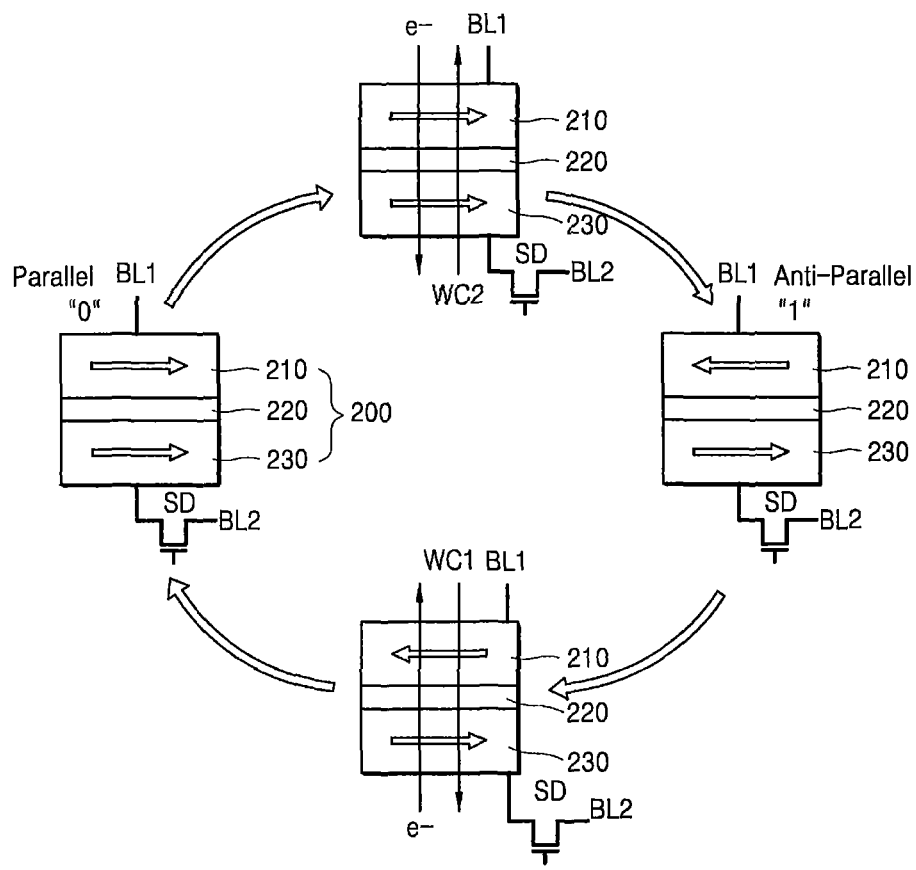
FIG. 13 is a view illustrating a write operation of a magnetic resistance device included in a variable resistance memory device, according to various embodiments according to the present inventive concepts.

FIG. 13 is a view illustrating a writing operation of a magnetic resistance device included in a variable resistance memory device according to various embodiments according to the present inventive concepts.

In detail, the magnetization direction of the free layer 210 may be determined in accordance with directions of write currents WC1 and WC2 that flow through the magnetic resistance device 200. For example, when a first write current WC1 is applied from the free layer 210 to the pinned layer 230, free electrons having the same spin direction as the pinned layer 230 apply torque to the free layer 210. Therefore, the free layer 210 is magnetized to run parallel with the pinned layer 230.

When a second write current WC2 is applied from the pinned layer 230 to the free layer 210, electrons having a spin opposite to a spin of the pinned layer 230 return to the free layer 210 and apply torque. Therefore, the free layer 210 is magnetized to be anti-parallel with the pinned layer 230. That is, in the magnetic resistance device 200, the magnetization direction of the free layer 210 may change due to spin transfer torque (STT).

Figure 14:
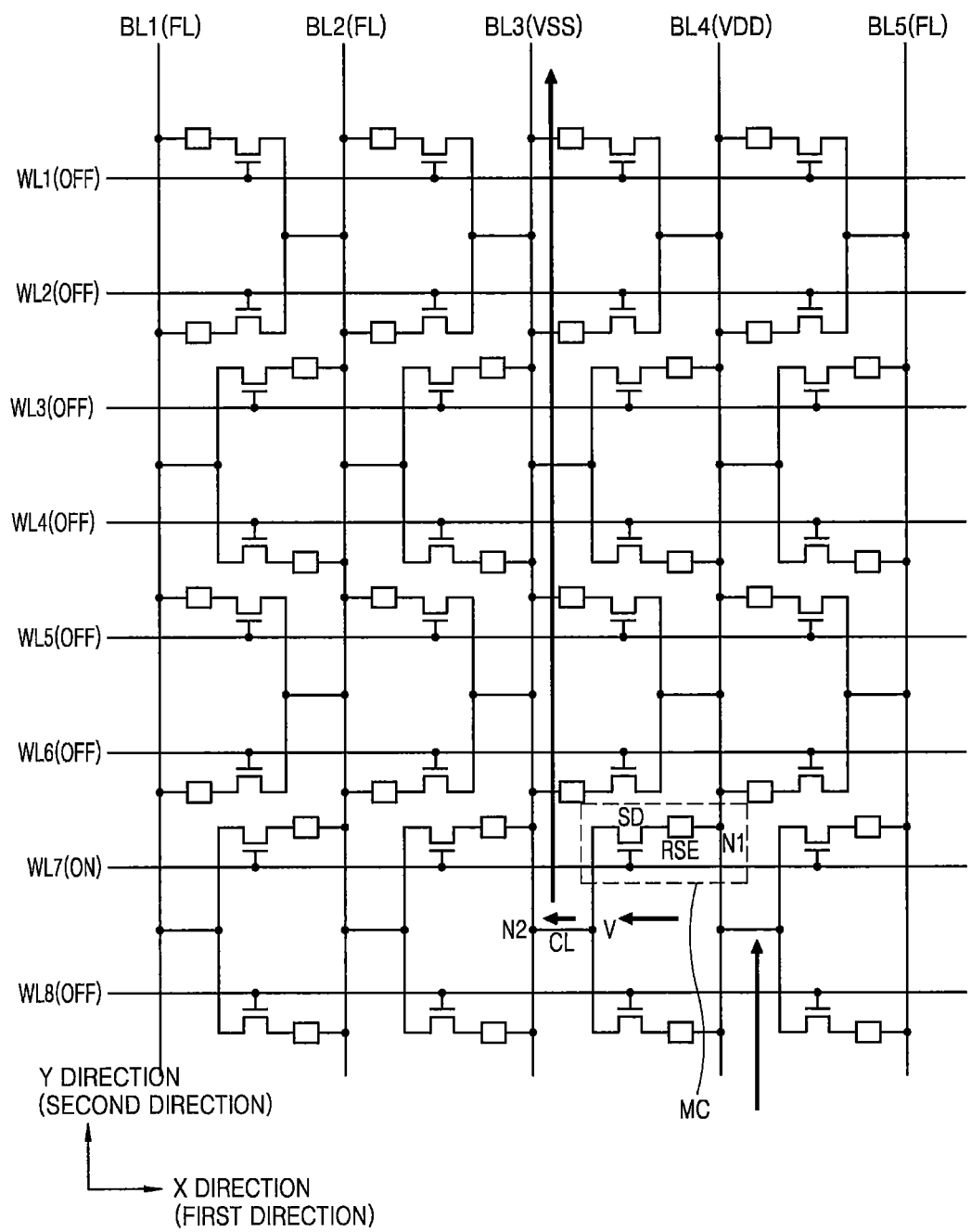
FIGS. 14 to 16 are views illustrating a principle of recording data "0" and "1" in a variable resistance memory device according to the present inventive concepts.
Figure 15:
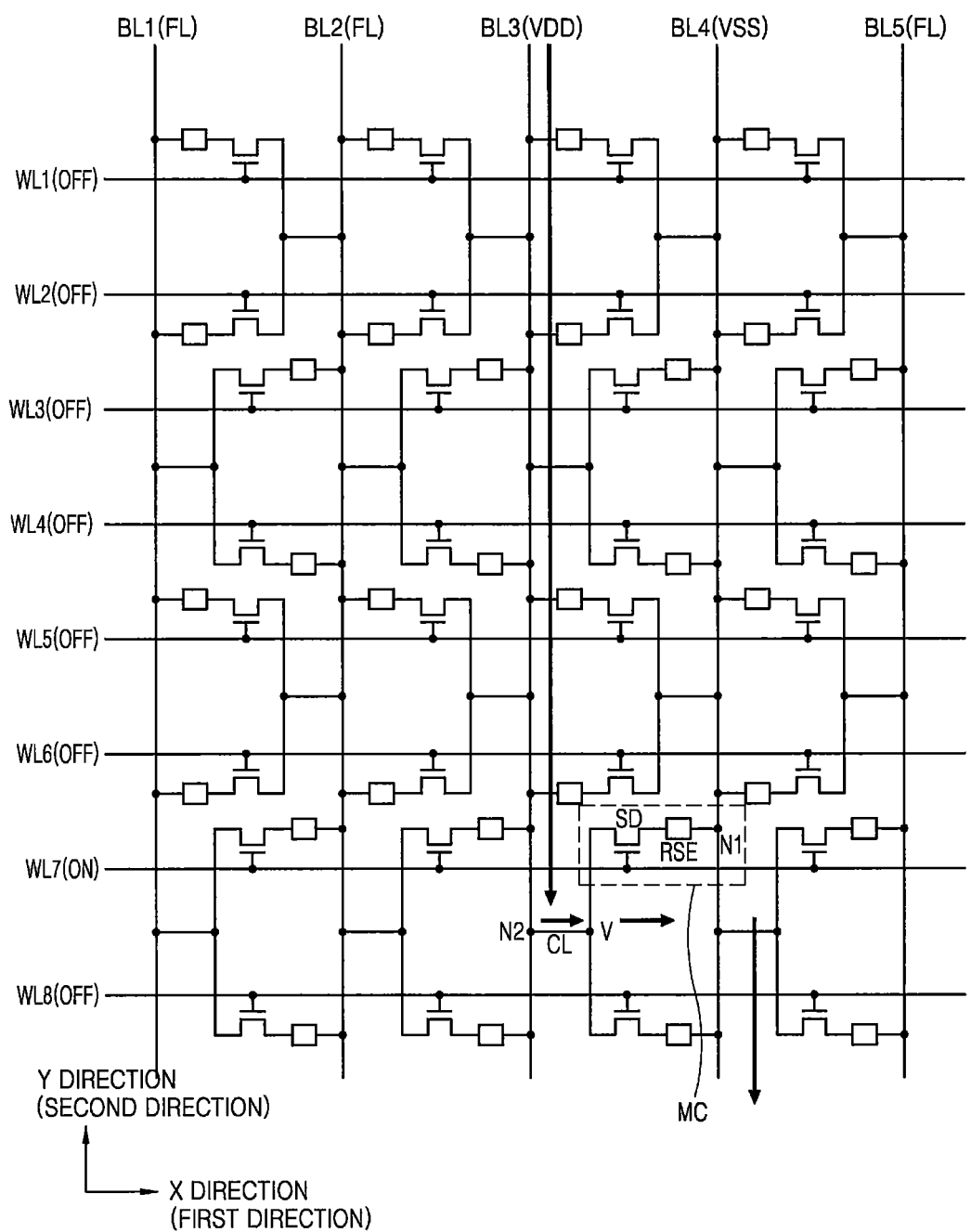
Figure 16:
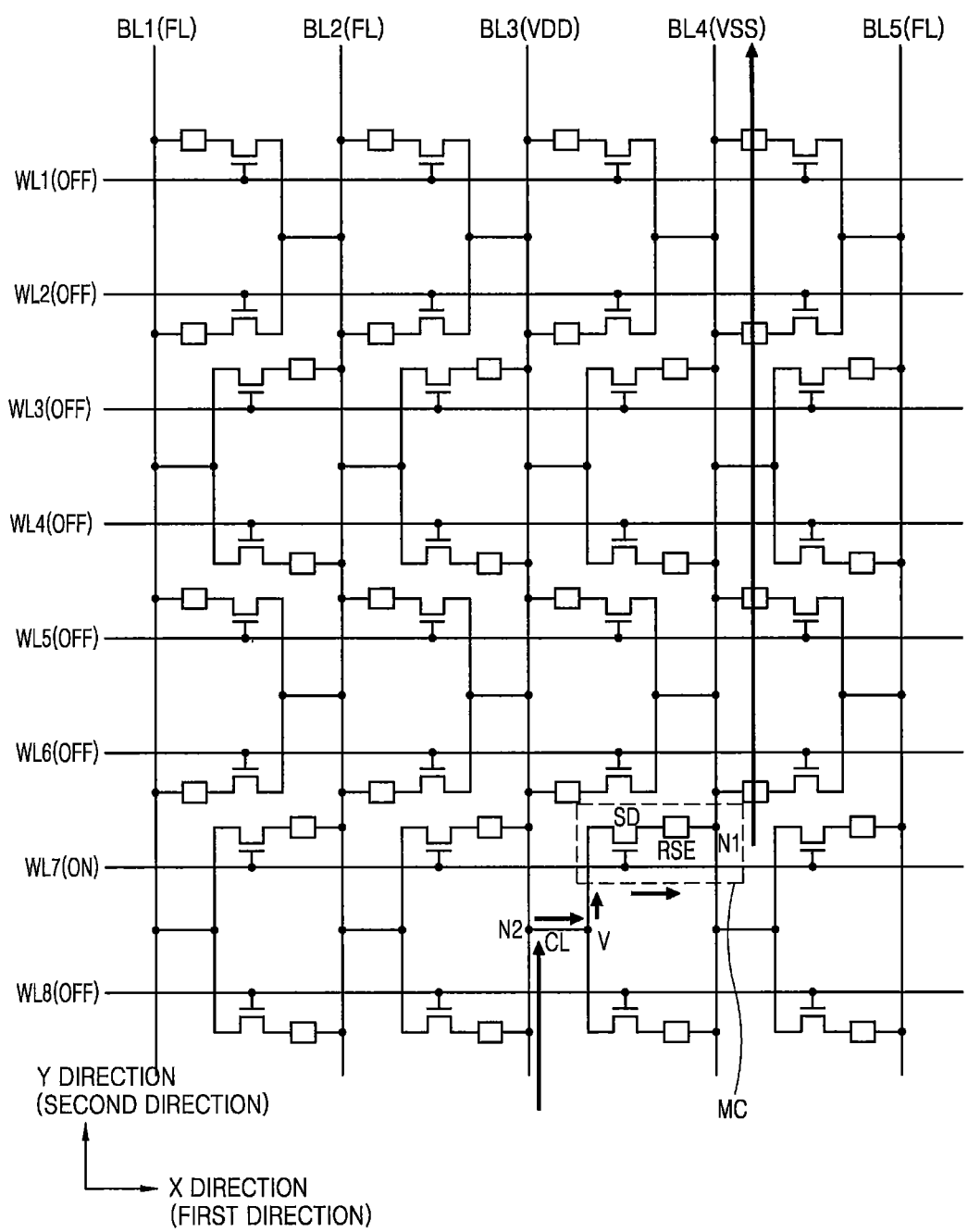

FIGS. 14 to 16 are views illustrating a principle of recording data "0" and "1" in a variable resistance memory device according to the present inventive concepts.

Referring to FIG. 14, in a case in which the data "0" is to be recorded in a selected memory cell MC, when the seventh word line WL7, the fourth bit line BL4, and the third bit line BL3 are selected, only the selected memory cell MC is determined.

When a proper turn-on voltage is applied to the seventh word line WL7, a high voltage VDD is applied to the fourth bit line BL4, and a low voltage VSS is applied to the third bit line BL3, and a current path marked with arrows is generated and the data "0" may be recorded in the selected memory cell MC.

Voltages may not be applied to the word lines WL1 to WL6 and WL8 other than the seventh word line WL7. The bit lines BL1 to BL2 and BL5 other than the fourth bit line BL4 and the third bit line BL3 may be floated/floating (FL). A high voltage applied to the fourth bit line BL4 is, for example, 1.2V and a low voltage applied to the third bit line BL3 may be, for example, 0V. However, the values of the high voltage and the low voltage are provided as examples, and alternative values may be used.

In the current path, as marked with arrows, a current is transmitted from a lower side of the fourth bit line BL4, passes through the third bit line BL3 adjacent to the fourth bit line BL4 on the left, and may flow to an upper side of the third bit line BL3 in the second direction. That is, the current path may be from the lower side of the fourth bit line BL4 to the upper side of the third bit line BL3 adjacent to the fourth bit line BL4.

In FIG. 14, when the resistance sensing device of the memory cell is a magnetic resistance device, as illustrated in FIG. 13, the free layer 210 of the magnetic resistance device may be magnetized to run parallel with the pinned layer 230.

Referring to FIGS. 15 and 16, when the data "1" is to be recorded in the selected memory cell MC, when the seventh word line WL7, the third bit line BL3, and the fourth bit line BL4 are selected, only the selected memory cell MC is determined.

When a proper turn-on voltage is applied to the seventh word line WL7, the high voltage VDD is applied to the third bit line BL3, and the low voltage VSS is applied to the fourth bit line BL4, a current path marked with arrows is generated and the data "1" may be recorded in the selected memory cell MC. Voltages may not be applied to the word lines WL1 to WL6 and WL8 other than the seventh word line WL7. The bit lines BL1 to BL2 and BL5 other than the fourth bit line BL4 and the third bit line BL3 may be floated. A high voltage applied to the third bit line BL3 is, for example, 1.2V and a low voltage applied to the fourth bit line BL4 may be, for example, 0V. However, the values of the high voltage and the low voltage are merely provided as examples.

The current paths of FIGS. 15 and 16 may be different from each other as marked with arrows. In the current path of FIG. 15, as marked with arrows, a current is transmitted from an upper side of the third bit line BL3, passes through the fourth bit line BL4 adjacent to the third bit line BL3 on the right, and may flow to a lower side of the fourth bit line BL4 in the second direction (the Y direction).

That is, the current path may be from the upper side of the third bit line BL3 to the lower side of the fourth bit line BL4 adjacent to the third bit line BL3. The current path of FIG. 15 is in the second direction (the Y direction) opposite to the direction of the current path of FIG. 14.

In the current path of FIG. 16, as marked with arrows, a current is transmitted from a lower side of the third bit line BL3, passes through the fourth bit line BL4 adjacent to the third bit line BL3 on the right, and may flow to an upper side of the fourth bit line BL4 in the second direction (the Y direction).

That is, the current path of FIG. 16 may be from the lower side of the third bit line BL3 to the upper side of the fourth bit line BL4 adjacent to the third bit line BL3. The current path of FIG. 16 is in the second direction (the Y direction) that is the same as the direction of the current path of FIG. 14. Therefore, in the variable resistance device according to the present inventive concepts, the data "0" and "1" may be recorded in the memory cell MC not in both directions but in one direction of a bit line.

In FIGS. 15 and 16, when the resistance sensing device of the memory cell is a magnetic resistance device, as illustrated in FIG. 13, the free layer 210 of the magnetic resistance device may be magnetized to be anti-parallel with the pinned layer 230.

As described above, in the variable resistance memory device according to the present inventive concepts, during a writing operation, bit lines on the left and right of the selected memory cell MC are used so that a circuit may be configured simply. Furthermore, in the variable resistance memory device according to the present inventive concepts, the current paths may be in the second direction (the Y direction), that is, the same direction or may be in opposite directions so that a circuit may be configured simply.

Although the present inventive concepts have been particularly shown and described with reference to example embodiments thereof, it will be understood that various changes in form and details may be made therein without departing from the spirit and scope of the present inventive concepts as defined by the following claims.

What is claimed is:
1. A variable resistance memory device comprising:
   a memory cell comprising a switching device and a resistance sensing element that is connected in series with the switching device;
   a word line that extends in a first direction and that is connected to a gate of the switching device; and
   a plurality of bit lines extending in a second direction,
   wherein a first connection node of a first bit line among the plurality of bit lines is electrically connected to the resistance sensing element,
   wherein a second connection node of a second bit line, among the plurality of bit lines, adjacent the first bit line is electrically connected to the switching device, and
   wherein the first bit line and the second bit line are each more than twice as wide in the first direction as a width of the word line in the second direction.
2. The variable resistance memory device of claim 1, further comprising a conductive line and a via,
   wherein the second connection node of the second bit line is electrically connected to the switching device through the conductive line and the via, and
   wherein the memory cell is free of any source line.
3. The variable resistance memory device of claim 2, further comprising a substrate,
   wherein the conductive line, the via, the first bit line, and the second bit line are on the substrate, and
   wherein the conductive line and the via are closer than the first bit line and the second bit line to a surface of the substrate.
4. The variable resistance memory device of claim 1, further comprising a substrate,
   wherein the first bit line and the second bit line are on the substrate, and
   wherein the first bit line and the second bit line are equidistant from a surface of the substrate.
5. The variable resistance memory device of claim 1,
   wherein the memory cell comprises one among a first plurality of memory cells that is electrically connected to the second connection node,
   wherein the switching device comprises one among a first plurality of switching devices of the first plurality of memory cells,
   wherein the variable resistance memory device further comprises a second plurality of memory cells comprising a second plurality of switching devices,
   wherein the first bit line comprises a third connection node that is spaced apart from the first connection node, and
   wherein the third connection node is electrically connected to the second plurality of switching devices of the second plurality of memory cells.
6. The variable resistance memory device of claim 5, further comprising a first conductive line, a second conductive line, a first via, and a second via,
   wherein the second connection node of the second bit line is electrically connected to the first plurality of switching devices through the first conductive line and the first via, and wherein the third connection node of the first bit line is electrically connected to the second plurality of switching devices of the second plurality of memory cells through the second conductive line and the second via.

7. The variable resistance memory device of claim 6, further comprising a substrate,
wherein the second conductive line, the second via, the first bit line, and the second bit line are on the substrate, and
wherein the second conductive line and the second via are closer than the first bit line and the second bit line to a surface of the substrate.

8. The variable resistance memory device of claim 5,
wherein the second plurality of memory cells comprises a plurality of resistance sensing elements, respectively,
wherein the second bit line comprises a fourth connection node that is spaced apart from the second connection node, and
wherein the fourth connection node is electrically connected to the plurality of resistance sensing elements of the second plurality of memory cells.

9. The variable resistance memory device of claim 1, wherein the first bit line and the second bit line are each three to four times wider in the first direction than the width of the word line in the second direction.

10. A variable resistance memory device comprising:
a plurality of memory cells comprising a plurality of resistance sensing elements, respectively, and a plurality of switching devices, respectively, wherein the plurality of resistance sensing elements is connected in series with the plurality of switching devices, respectively;
a plurality of word lines extending in a first direction and spaced apart from each other in a second direction, wherein the plurality of word lines is connected to a plurality of gates, respectively, of the plurality of switching devices, respectively; and
a plurality of bit lines extending in the second direction and spaced apart from each other in the first direction,
wherein a first connection node of a first bit line among the plurality of bit lines is electrically connected to first ones of the plurality of resistance sensing elements, and a second connection node of a second bit line, among the bit lines, adjacent the first bit line is electrically connected to first ones of the plurality of switching devices,
wherein the first ones of the plurality of resistance sensing elements are connected in series with the first ones of the plurality of switching devices, respectively,
wherein a third connection node of the first bit line is electrically connected to second ones of the plurality of switching devices, and a fourth connection node of the second bit line is electrically connected to second ones of the plurality of resistance sensing elements,
wherein the second ones of the plurality of resistance sensing elements are connected in series with the second ones of the plurality of switching devices, respectively,
wherein the second connection node of the second bit line is electrically connected to the first ones of the plurality of switching devices through a first conductive line and a first via, and
wherein the third connection node of the first bit line is electrically connected to the second ones of the plurality of switching devices through a second conductive line and a second via.

11. The variable resistance memory device of claim 10,
wherein the plurality of memory cells comprises a first memory cell, a second memory cell, a third memory cell, and a fourth memory cell,
wherein the first ones of the plurality of resistance sensing elements comprises a first resistance sensing element of the first memory cell and a second resistance sensing element of the second memory cell,
wherein the second ones of the plurality of resistance sensing elements comprises a third resistance sensing element of the third memory cell and a fourth resistance sensing element of the fourth memory cell,
wherein the first connection node of the first bit line is electrically connected to the first resistance sensing element and the second resistance sensing element, and
wherein the fourth connection node of the second bit line is electrically connected to the third resistance sensing element and the fourth resistance sensing element.

12. The variable resistance memory device of claim 10,
wherein the first ones of the plurality of resistance sensing elements and the second ones of the plurality of switching devices are sequentially connected to the first bit line in the second direction, and
wherein the first ones of the plurality of switching devices and the second ones of the plurality of resistance sensing elements are sequentially connected to the second bit line in the second direction.

13. The variable resistance memory device of claim 10, wherein the first bit line and the second bit line are each wider in the first direction than a pitch between the plurality of word lines in the second direction.

14. The variable resistance memory device of claim 13, wherein the first bit line and the second bit line are each three to four times wider in the first direction than a width of a first word line among the plurality of word lines in the second direction.

15. A variable resistance memory device comprising:
a plurality of first memory cell groups spaced apart from each other in a first direction and a second direction perpendicular to the first direction, each of the plurality of first memory cell groups comprising a first plurality of memory cells comprising a first plurality of resistance sensing elements, respectively, that is connected in series with a first plurality of switching devices, respectively, wherein ones of the first plurality of switching devices are electrically connected to each other,
a plurality of second memory cell groups between the first plurality of memory cell groups, each of the plurality of second memory cell groups comprising a second plurality of memory cells comprising a second plurality of resistance sensing elements, respectively, that is connected in series with a second plurality of switching devices, respectively, wherein ones of the second plurality of switching devices are electrically connected to each other;
a plurality of word lines spaced apart from each other in the second direction, extending in the first direction, and electrically connected to gates of the first plurality of switching devices and the second plurality of switching devices;
first bit lines that are spaced apart from each other the first direction, that extend in the second direction, that are electrically connected to the first plurality of resistance sensing elements, and that are electrically connected to the second plurality of switching devices; and
second bit lines adjacent the first bit lines, wherein the second bit lines are electrically connected to the first plurality of switching devices, and are electrically connected to the second plurality of resistance sensing elements, wherein the plurality of first memory cell groups and the plurality of second memory cell groups are alternately arranged along the first bit lines in the second direction.

16. The variable resistance memory device of claim 15, wherein the plurality of first memory cell groups and the plurality of second memory cell groups are alternately arranged along the second bit lines in the second direction.

17. The variable resistance memory device of claim 15, wherein the plurality of first memory cell groups and the plurality of second memory cell groups are arranged in a zigzag pattern along the second bit lines.

18. The variable resistance memory device of claim 15, wherein one of the second bit lines is electrically connected to one of the first plurality of switching devices through a first conductive line and a first via.

19. The variable resistance memory device of claim 18, wherein one of the first bit lines is electrically connected to one of the second plurality of switching devices through a second conductive line and a second via.

20. The variable resistance memory device of claim 15, wherein the first plurality of memory cells and the second plurality of memory cells are free of any source line.

* * * * *